US006259130B1

(12) United States Patent
Wu

(10) Patent No.: US 6,259,130 B1
(45) Date of Patent: Jul. 10, 2001

(54) HIGH DENSITY FLASH MEMORIES WITH HIGH CAPACITIVE-COUPING RATIO AND HIGH SPEED OPERATION

(75) Inventor: Shye-Lin Wu, Hsinchu (TW)

(73) Assignee: Texas Instruments - Acer Incorporated, Hsinchu (TW)

( * ) Notice: Subject to any disclaimer, the term of this patent is extended or adjusted under 35 U.S.C. 154(b) by 0 days.

(21) Appl. No.: 09/265,062

(22) Filed: Mar. 9, 1999

Related U.S. Application Data

(63) Continuation of application No. 09/036,027, filed on Mar. 6, 1998.

(51) Int. Cl.[7] .................................................. H01L 26/76
(52) U.S. Cl. ..................... 257/314; 257/309; 257/310; 257/315; 257/316; 257/317; 257/319; 257/320; 257/321; 257/325; 257/739
(58) Field of Search .................................. 257/309, 310, 257/314–317, 319–321, 325, 739

(56) References Cited

U.S. PATENT DOCUMENTS

| 4,099,196 | * | 7/1978 | Simko | 357/23 |
| 5,087,583 | * | 2/1992 | Hazani | 437/43 |
| 5,089,867 | * | 2/1992 | Lee | 357/23.5 |
| 5,208,176 | * | 5/1993 | Ahmad et al. | 437/47 |
| 5,635,415 | * | 6/1997 | Hong | 438/261 |
| 5,972,771 | * | 10/1999 | Figura | 438/398 |
| 6,043,124 | * | 3/2000 | Wu | 438/260 |

\* cited by examiner

*Primary Examiner*—Eddie C. Lee
*Assistant Examiner*—Matthew E. Warren

(57) ABSTRACT

The device includes a gate oxide formed on a semiconductor substrate. Oxide regions are respectively formed on the substrate and adjacent to the gate oxide. Textured oxides are formed on the substrate, between the gate oxide and the oxide regions. A floating gate consists of a first polysilicon portion, second polysilicon portions and a third portion that is composed of hemisperical grained silicon (HSG-Si). The first polysilicon portion is formed on the gate oxide. Isolations are formed on the side walls of the first polysilicon portion. The second polysilicon portions are respectively formed next to the isolations and over a portion of the oxide regions. The HSG-Si is formed on the upper surface of the first polysilicon portion and the second polysilicon portions. A dielectric layer is formed on the HSG-Si of the floating gate. A control gate is formed on the dielectric layer. The doped regions are formed in the substrate and under the textured oxides and the oxide regions.

17 Claims, 4 Drawing Sheets

HIGH DENSITY FLASH MEMORIES WITH HIGH CAPACITIVE-COUPING RATIO AND HIGH SPEED OPERATION

This is a continuation application of U.S. Ser. No. 09/036,027 filed Mar. 6, 1998, entitled "METHOD OF FORMING HIGH CAPACITIVE-COUPLING RATIO AND HIGH SPEED FLASH MEMORIES WITH A TEXTURED TUNNEL OXIDE".

FIELD OF INVENTION

The present invention relates to a semiconductor device, and more specifically, to a method of fabricating flash memories.

BACKGROUND OF THE INVENTION

Various nonvolatile memories have been disclosed in the prior art. For example, Mitchellx has proposed EPROMs with a self-aligned planar array cell. In this technique, buried diffusion self-aligned to the floating gate avalanche injection MOS transistors are used for the bit lines. Cross point array technology has been disclosed. The self-aligned source and drain will allow this device to be optimized even further for programming speed. See A. T. Mitchellx, "A New Self-Aligned Planar Cell for Ultra High Density EPROMs", IEDM, Tech. pp. 548–553 (1987).

Flash memory is one of the segments of nonvolatile memory devices. The device includes a floating gate to store charges and an element for electrically placing charge on and removing the charges from the floating gate. One of the applications of flash memory is BIOS for computer. Typically, the high-density nonvolatile memories can be applied as the mass storage of portable handy terminals, solid state camera and PC cards. That is because the nonvolatile memories exhibit many advantages, such as a fast access time, low power dissipation, and robustness. Bergemont proposed another cell array for portable computing and telecommunications application, which can be seen in Bergmont et al., "Low Voltage NVG™: A New High Performance 3 V/5 V Flash Technology for Portable Computing and Telecommunications Applications", IEEE Trans. Electron Devices, vol. ED-43, p. 1510, 1996. This cell structure is introduced for low voltage NOR Virtual Ground (NVG) flash memory having fast access time. In the flash array schematic, field oxides (FOX) are formed between cells such that a poly extension on FOX of each cell provides adequate gate coupling ratio. Bergmont also mentioned that the portable telecommunications and computing have become a major driving force in the field of integrated circuits. In the article, the access time is one of the key concerns for low voltage read operation. The NVG array uses select devices to achieve a fast access time by reducing the pre-charge time to that of a single segment rather than the full bit-line.

The trend of formation of nonvolatile memories is moving to low supply power and fast access because these requirements are necessary for the application of the mobile computing system. One important key parameter of the high performance memory is capacitive-coupling ratio. The prior art proposed a structure to increase the capacitive-coupling ratio by using hemispherical grained (HSG) silicon to increase the surface area of floating gate. Buried $n^+$ diffusion layers are formed with self-aligned arsenic ion implantation and the cell structure works at 3V. (Please see Shirai, et al., "A $0.54\mu m^2$ Self-Aligned, HSG Floating Gate Cell for 256Mbit Flash Memories", IEDM Tech. Dig., p.653 (1995).)

Flash memory needs charges to be held in the floating gate for long periods of time. Therefore, the dielectric that is used for insulating the floating gate needs to be high performance. At present, the low voltage flash memory is applied with a voltage of about 3 V or 5 V during charging or discharging the floating gate. As is known in the art, tunneling is a basic technology in charging or discharging. In order to attain high tunneling efficiency, the thickness of the dielectric between the floating gate and the substrate have to be scaled down due to the supply voltage is reduced. However, it will degrade the reliability of the dielectric when the thickness of the dielectric is scaled down below 10 nm. These can refer to articles "Flash Technology: Challenge and Opportunities", Raghupathy V. Giridhar, Jap. J. Appl. Phys. Vol. 35 pp. 6347–6350 (1996) and K. Yoshikawa et al., "Comparison of Current Flash EEPROM Erasing Methods: Stability and How to Control", IEDM, Tech. Dig., p595 (1992).

SUMMARY OF THE INVENTION

The object of the present invention is to provide a memory device with textured tunneling oxide and HSG-Si floating gate.

The further object of the present invention is to enhance the tunneling efficiency and increase the capacitive-coupling ratio.

In the present invention, undoped hemispherical grained silicon (HSG-Si) or amorphous silicon will be used to form a textured tunneling oxide to enhance the tunneling efficiency. The structure can increase the capacitive-coupling ratio. Furthermore, the HSG-Si is also introduced in the application to act as a part of the floating gate. Thus, the floating gate has a larger surface area. The nonvolatile memory according to the present invention includes a gate oxide formed on a semiconductor substrate. Oxide regions are respectively formed on the substrate and adjacent to the gate oxide. Textured oxides are formed on the substrate, between the gate oxide and the oxide regions. A floating gate is consisted of a first polysilicon portion, second polysilicon portions and a third portion composed of hemisperical grained silicon (HSG-Si). The first polysilicon portion is formed on the gate oxide. Isolations are formed on the side walls of the first polysilicon portion. The second portions are respectively formed next to the isolations and over a portion of the oxide regions. The HSG-Si of the floating gate having a rugged surface to increase the surface area is formed on the upper surface of the first polysilicon portion and the second polysilicon portions. A dielectric layer is formed on the HSG-Si of the floating gate and on the side walls of the second polysilicon portion. A control gate is formed on the dielectric layer. The doped regions are formed in the substrate and under the textured oxides and the oxide regions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 12:
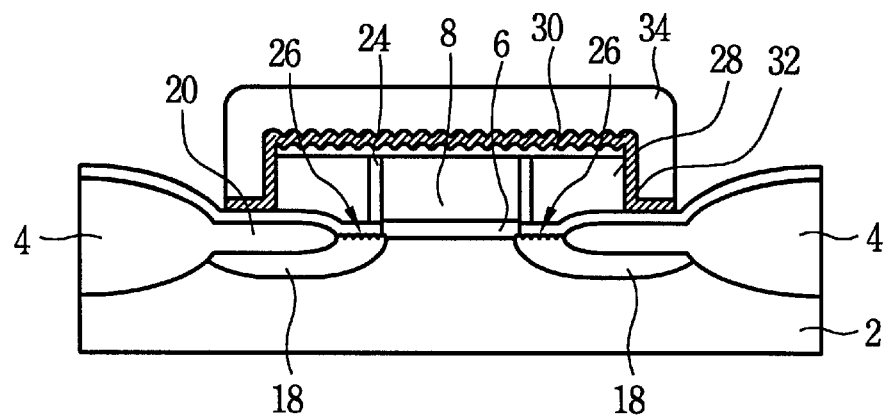
FIG. 12 is a cross-sectional view of a semiconductor wafer illustrating the step of forming a control gate according to the present invention.

The present invention proposes a novel method to fabricate a flash nonvolatile memory. In the method, undoped hemispherical grained silicon (HSG-Si) or amorphous silicon will be used to form a textured tunneling oxide to enhance the tunneling efficiency. The structure can increase the capacitive-coupling ratio. The textured structure is constructed by the rapid diffusion of oxygen rough the grain boundaries of the silicon film into silicon substrate. Furthermore, the HSG-Si is also introduced in the application to act as a part of the floating gate. Thus, the floating gate has a larger surface. The detailed description is as follows. Referring to FIG. 12, the nonvolatile memory according to the present invention includes a gate oxide 6 formed on a semiconductor substrate 2. Typically, the gate oxide 6 is composed of silicon oxide. Oxide regions 20 are respectively formed on the substrate 2 and adjacent to the gate oxide 6. Textured oxides 26 are composed of silicon oxide and are formed on the substrate, between the gate oxide 6 and the oxide regions 20.

A floating gate consists of a first portion 8, second portions 28 and a third portion 34. The first portion 8 of the floating gate is formed on the gate oxide 6. Isolations 24 are formed on the side walls of the first portion 8. Further, the second portions 28 are respectively formed next to the isolations 24 and over a portion of the oxide regions 20. The first portion 8 and the second portions 28 are composed of polysilicon. The third portion 34 of the floating gate having a rugged surface to increase the surface area is formed on the upper surface of the first portion 8. The third portions 34 can be formed by means of hemispherical grained silicon. A dielectric layer 32 is formed on the third portion of the floating gate, the side walls of the second portion 28 and on a portion of the oxide regions 20. A control gate is formed on the dielectric layer 32, and doped regions 18 are formed in the substrate 2 and under the textured oxides 26 and the oxide regions 20.

The method for forming the aforesaid structure is described as follows. A semiconductor substrate is provided for the present invention. In a preferred embodiment, as shown in the FIG. 1, a single crystal silicon substrate 2 with a <100> crystallographic orientation is provided. A plurality of isolations 4 between devices are formed on the substrate 2. In general, field oxide (FOX) isolation or trench isolation techniques can be introduced to serve as the isolations 24. For example, the FOX regions 4 can be formed via lithography and etching steps to etch a silicon nitride/silicon dioxide composition layer. After the photoresist is removed and wet cleaned, thermal oxidation in steam environment is used to grow the FOX regions 4. As is known in the art, a shallow trench isolation technique can be used to replace the FOX.

A thin gate oxide layer 6 consisting of silicon oxide is formed on the substrate 2. Typically, the gate oxide 6 can be grown in an oxygen ambient at a temperature of about 700 to 1100 degrees centigrade. Other methods such as chemical vapor deposition, can also be used to form the gate oxide 6. In the present embodiment, the thickness of the silicon dioxide layer 6 is approximately 15–250 angstroms. In addition, ultra thin silicon nitride formed by jet vapor deposition (JVD) can be selected as the gate dielectric. The JVD nitride exhibits excellent electrical properties. Compared to thermal oxide, the JVD nitride includes lower leakage current and higher resistance to boron penetration. The JVD can be deposited at room temperature using JVD technique, followed by annealing at about 800 to 850 centigrade degrees.

Subsequently, a doped polysilicon layer 8 is deposited on the gate oxide layer 6. Generally, the polysilicon layer 8 is chosen from doped polysilicon or in-situ polysilicon. For an embodiment, the doped polysilicon layer 8 is doped by phosphorus using a $PH_3$ source. Then, a silicon nitride layer ($SiN_x$) 10 is deposited on the polysilicon layer 8 to acting as an anti-reflective coating (ARC) layer to improve the resolution of lithography. Any suitable process can be used to form the silicon nitride layer 10. As is known by a person of ordinary skills in the art, the silicon nitride layer 10 can be formed using Low Pressure Chemical Vapor Deposition (LPCVD), Plasma Enhance Chemical Vapor Deposition (PECVD), and so on. Further, the temperature forming the silicon nitride layer 10 is at a range of 300–800 degrees centigrade. In the preferred embodiment, the reaction gases of the step to form silicon nitride layer 10 are $SiH_4$, $NH_3$, $N_2$, $N_2O$ or $SiH_2Cl_2$, $NH_3$, $N_2$, $N_2O$.

Figure 1:
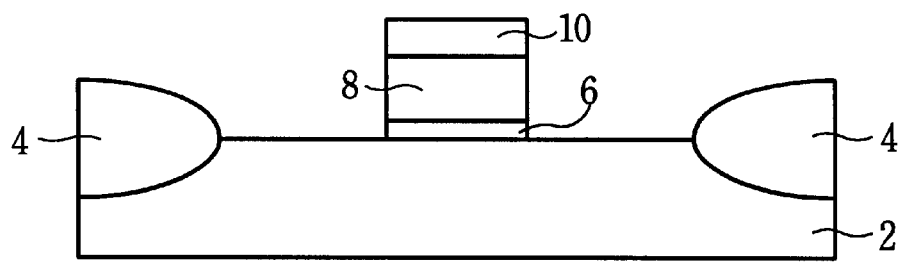
FIG. 1 is a cross-sectional view of a semiconductor wafer illustrating the steps of forming a gate structure on a semiconductor substrate according to the present invention.

Next, and still referring to FIG. 1, standard lithography and etching steps are used to etch the silicon nitride layer 10, polysilicon layer 8 and gate oxide 6 to the surface of the substrate 2 for forming a gate structure.

Figure 2:
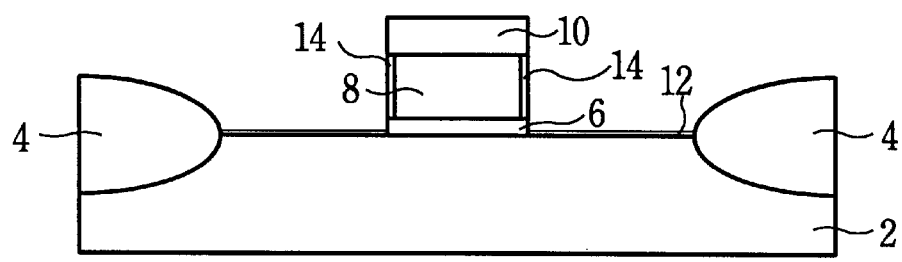
FIG. 2 is a cross-sectional view of a semiconductor wafer illustrating the step of forming polyoxide according to the present invention.

Turning to FIG. 2, subsequently, an ultra thin dielectric layer, such as silicon oxynitride layer 12, is formed on the substrate 2 where is exposed by the gate structure. In such case, the silicon oxide layer 12 is formed by thermal oxidation in $N_2O$ or NO environment. This can also be done in an $N_2$ and $O_2$ ambient. The temperature for forming the silicon oxide layer 12 ranges from 700 to 1150 degrees centigrade. The thickness is preferably about 25 to 150 angstroms. Further, a polyoxide layer 14 is simultaneously formed on the side walls of the gate structure in the procedure.

Figure 3:
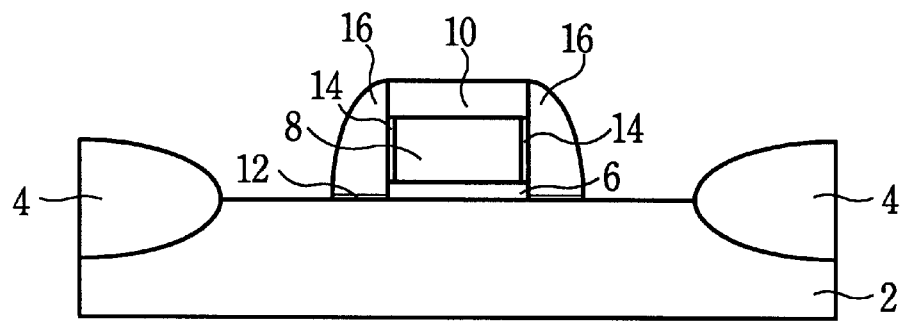
FIG. 3 is a cross-sectional view of a semiconductor wafer illustrating the step of forming silicon nitride side wall spacers according to the present invention.

Then, side wall spacers 16 are formed on the side walls of the gate structure for isolating, as shown in FIG. 3. In order to achieve this, a dielectric layer, such as silicon nitride layer, is formed on the surface of the substrate 2 and along a surface of the gate structure. Successively, the dielectric layer is anisotropically etched using an anisotropical etching process to construct the side wall spacers 16. In such case, the dielectric layer can be formed of a silicon nitride layer, which is formed by using the aforesaid method. Thus, only the portions of the oxide 12 under the side wall spacers 16 are left and adjacent to the gate oxide 6.

Figure 4:
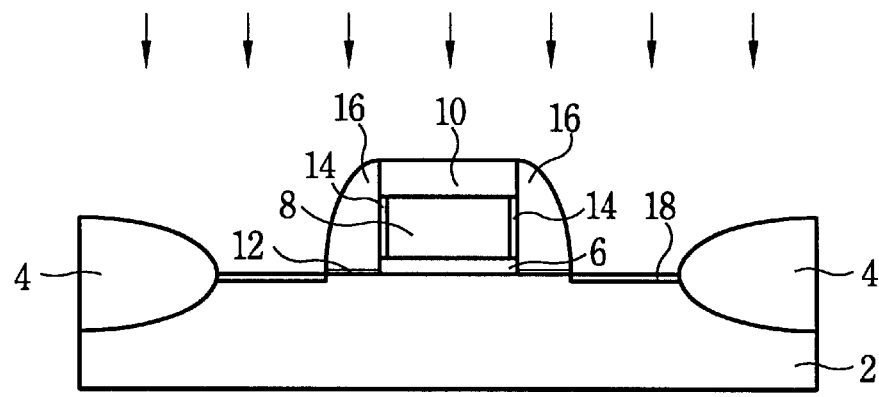
FIG. 4 is a cross-sectional view of a semiconductor wafer illustrating the step of forming source and drain according to the present invention.

The source/drain structure of the device may now be fabricated using conventional masking and ion implantation steps. Please turn to FIG. 4. An ion implantation is carried out to dope dopants into the substrate 2 by using the gate structure and side wall spacers 16 as a mask. In this step, a buried conductive diffusion layer 18 is formed in the substrate 2 adjacent to the gate structure to serve as source and drain. For example, n type conductive dopants may be used for the implantation. The source and drain 18 are formed by a conventional ion implantation with n conductive type dopants such as phosphorus or arsenic at a dose about 2E15 to 5E16 atoms/cm$^2$, and an energy of about 0.5 to 120 KeV. It should be well understood by those skilled in the art that a p type conductive dopants could be used by simply substituting opposite dopants to those given for the aforesaid step.

Figure 5:
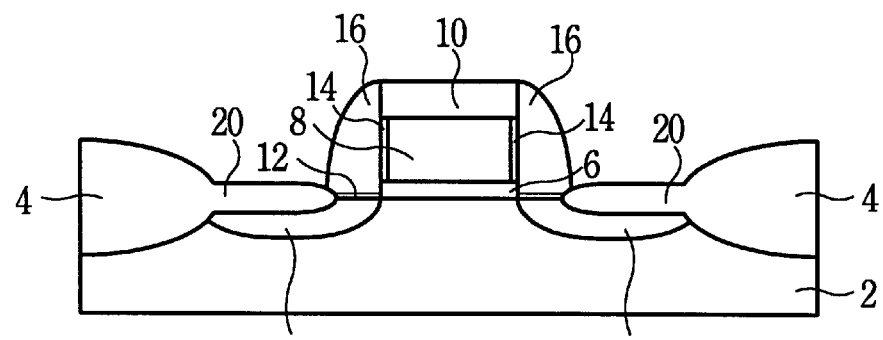
FIG. 5 is a cross-sectional view of a semiconductor wafer illustrating the step of performing a thermal process to drive the dopants into the substrate according to the present invention.

Turning to FIG. 5, a high temperature oxidation is performed to drive dopants deeper into the substrate 2. At the same time, an oxide layer 20 having a thickness about 500 to 2000 angstroms is grown on the top of the source and drain 18 that are exposed by the gate structure and the isolating spacers 16.

Figure 6:
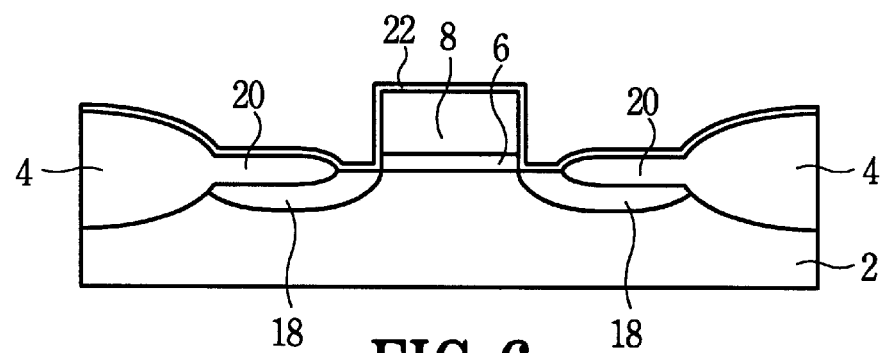
FIG. 6 is a cross-sectional view of a semiconductor wafer illustrating the steps of forming an amorphous silicon layer according to the present invention.

Turning to FIG. 6, the following step is to remove the side wall spacers 16 and the silicon nitride layer 10. The oxide layer 12 that is uncovered by the gate and the polyoxide layer 14 are then stripped, thereby exposing the gate structure and a portion of the source and drain 18. In the embodiment, the silicon nitride can be removed using hot phosphorus acid solution. Using HF solution or BOE (buffer oxide etching) solution can strip the oxide layer. Then, an undoped thin amorphous silicon layer 22 is formed on the surface of the gate structure, the oxide layer 20 and the exposed source and drain 18. The thickness of the undoped amorphous silicon layer 22 is about 20 to 200 angstroms. Further, hemispherical grained silicon (HSG-Si) can be used to replace the amorphous silicon layer 22. The amorphous silicon 22 is formed in a furnace at about 400 to 600 degrees centigrade in an ambient containing $SiH_4/N_2$.

Figure 7:
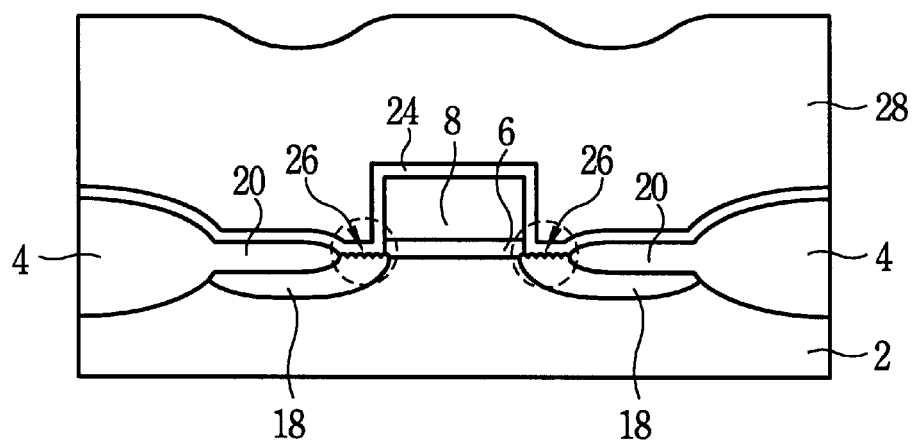
FIG. 7 is a cross-sectional view of a semiconductor wafer illustrating the steps of forming a textured tunneling oxide and a further polysilicon layer according to the present invention.

Turning to FIG. 7, a dry oxidation process is introduced at 700 to 1000 degrees centigrade in $O_2$ ambient to convert the amorphous silicon layer 22 into textured tunnel oxide 24 with textured profile 26 at the interface of the substrate 2 and the oxide 24. This structure is referred to TOPS (thermally oxidizing a polysilicon film on silicon substrate). The mechanism of forming the textured structure is the rapid diffusion of oxygen through the grain boundaries of the silicon film into silicon substrate 2 and the enhanced oxidation rate at the grain boundaries. Therefore, a textured silicon/oxide interface is achieved. The textured interface 26 results in localized high fields and enhances the electron injection into TOPS. The tunneling oxide 24 having textured interface 26 has a higher electron conduction efficiency and lower electron trapping rate. This can refer to an article proposed by S. L. Wu, "Characterization of Thin Textured Tunnel Oxide Prepared by Thermal Oxidation of Thin Polysilicon Film on Silicon", IEEE, Trans. Electron Devices, vol. ED-43, pp. 287–294 (1996).

The present invention has high capacitive-coupling ratio due to the extended area of the floating gate, therefor it can be used for low power operation. Further, the present invention exhibits high speed and low power operation due to the high electron injection efficiency of textured tunnel oxide. The read or write speed is higher than the conventional structure in read, write modes. Next, a polysilicon layer 28 is deposited on the patterned polysilicon 8 and the layer 24. The polysilicon layer 28 is formed of doped silicon or in-situ doped polysilicon. For example, the polysilicon layer 28 is formed to have n+ type conductive dopants.

Figure 8:
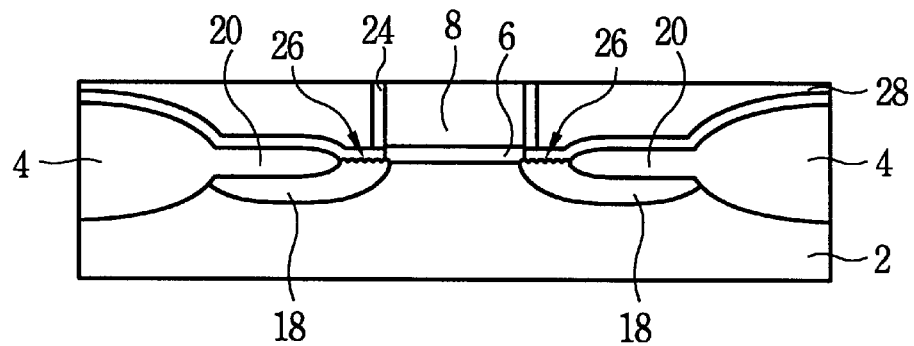
FIG. 8 is a cross-sectional view of a semiconductor wafer illustrating the step of performing a chemical mechanical polishing to polish the polysilicon layer according to the present invention.
Figure 9:
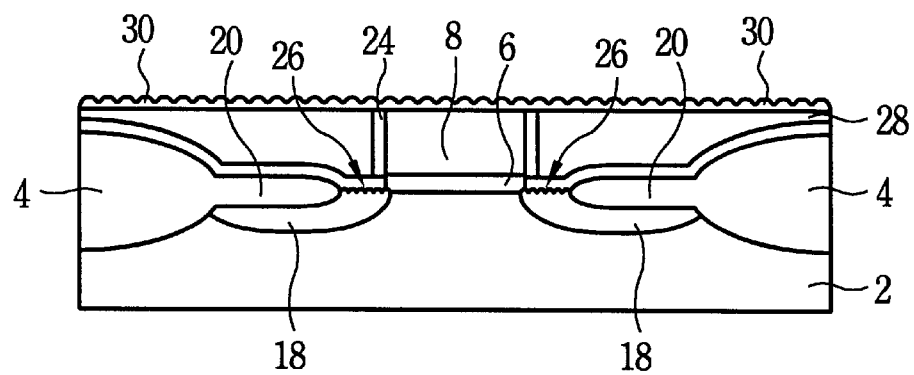
FIG. 9 is a cross-sectional view of a semiconductor wafer illustrating the step of forming a rugged polysilicon according to the present invention.
Figure 10:
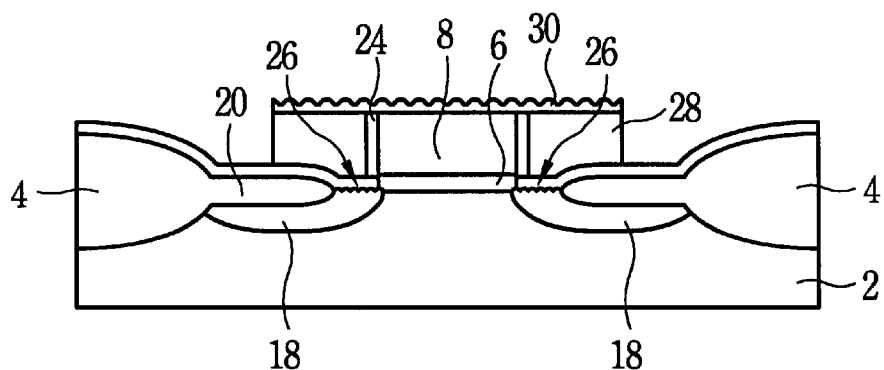
FIG. 10 is a cross-sectional view of a semiconductor wafer illustrating the step of defining the floating gate according to the present invention.

As shown in FIG. 8, subsequently, a chemical mechanical polishing (CMP) technique is used to polish a portion of the polysilicon layer 28. The oxide 24 at the top of the gate 8 is also removed during the CMP process, as shown in the scheme. The polysilicon layer 28 is separated into two parts adjacent to said gate structure in a cross-sectional view. A conductive structure is established to connect these parts and further to increase the surface of the subsequent floating gate. One of the methods to obtain the benefit is to form a rugged silicon layer 30 on the polysilicon layers 8 and 28. For example, a HSG-Si layer 30 can be utilized to act as the rugged polysilicon. The HSG-Si layer 30 includes n+ type conductive dopants in the case. FIG. 9 shows the resulting scheme after the step. The floating gate consists of the gate 8, the polysilicon layer 28 and the HSG-Si layer 30. The layer 30 sufficiently increases the surface area of the floating gate. Thus, the device formed by the present invention can gain the benefit of smaller size than conventional for similar capacitance of the devices due to the HSG-Si enlarges the surface. Then, an etching is performed to etch the polysilicon 28 and the rugged silicon layer 30 thereby defining the gate structure, as shown in FIG. 10.

Figure 11:
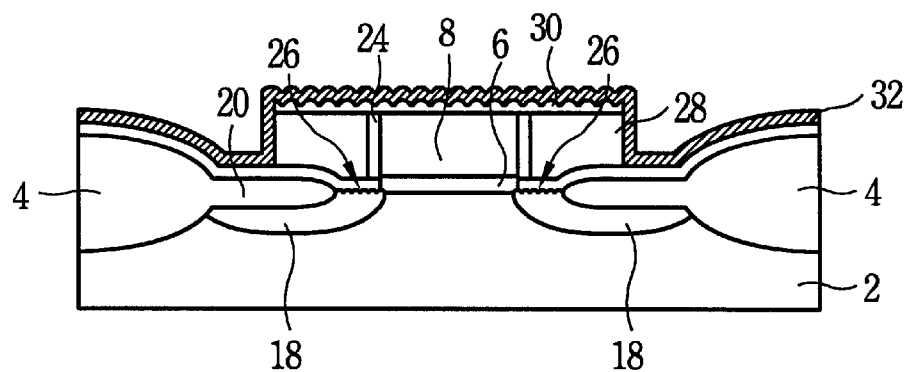
FIG. 11 is a cross-sectional view of a semiconductor wafer illustrating the step of forming a dielectric layer on the floating gate according to the present invention.

Referring to FIG. 11, an inter polysilicon dielectric (IPD) 32 is formed at the top of the defined floating gate for isolation. The ONO or NO film is used as the IPD 32. Finally, as can be seen by reference to FIG. 12, a conductive layer, such as n+ doped polysilicon layer 34, is formed on the IPD 32 as control gate. In addition, the metal, silicide or metal nitride compound or alloy layer can be used as the conductive layer. After the step, a patterning technique including lithography and etching processes is used to pattern the layers 34, 32, thereby forming the devices. The conductive layer acts as a control gate of the device.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A nonvolatile memory on a substrate, said nonvolatile memory comprising:

a gate dielectric formed on said substrate;

oxide regions respectively formed on said substrate and adjacent to said gate dielectric;

textured oxides formed on said substrate, between said gate dielectric and said oxide regions;

floating gate consisting of a first portion, second portions and a third portion, wherein said first portion of said floating gate formed on said gate dielectric, isolations being formed on the side walls of said first portion, said second portions being respectively formed next to said isolations and over a portion of said oxide regions, wherein said third portion of said floating gate having a rugged surface to increase the surface area is formed on the upper surface of said first portion and said second portions;

a dielectric layer formed on said third portion of said floating gate, side walls of said second portions;

a control gate formed on said dielectric layer; and doped regions formed in said substrate and under said textured oxides and said oxide regions.

2. The nonvolatile memory of claim 1, wherein said gate oxide comprises silicon oxide.

3. The nonvolatile memory of claim 1, wherein said textured oxides comprise silicon oxide.

4. The nonvolatile memory of claim 1, wherein said first portion of said floating gate comprises polysilicon.

5. The nonvolatile memory of claim 1, wherein said second portions of said floating gate comprise polysilicon.

6. The nonvolatile memory of claim 1, wherein said third portion comprises semispherical grained silicon.

7. The nonvolatile memory of claim 1, wherein said control gate comprises polysilicon.

8. The nonvolatile memory of claim 1, wherein said dielectric layer comprises ONO.

9. The nonvolatile memory of claim 1, wherein said dielectric layer comprises NO.

10. The nonvolatile memory of claim 1, wherein said dielectric layer comprises $Ta_2O_5$.

11. A nonvolatile memory on a substrate, said nonvolatile memory comprising:

a gate dielectric formed on said substrate;

oxide regions respectively formed on said substrate and adjacent to said gate dielectric;

textured oxides formed on said substrate, between said gate dielectric and said oxide regions;

floating gate consisting of a first polysilicon portion, second polysilicon portions and a third portion composed of semispherical grained silicon, wherein said first polysilicon portion formed on said gate dielectric, isolations being formed on the side walls of said first polysilicon portion, said second polysilicon portions being respectively formed next to said isolations and over a portion of said oxide regions, wherein said semispherical grained silicon having a rugged surface to increase the surface area is formed on the upper surface of said first polysilicon portion and said second polysilicon portions;

a dielectric layer formed on said third portion of said floating gate, side walls of said second portions;

a control gate formed on said dielectric layer; and doped regions formed in said substrate and under said textured oxides and said oxide regions.

12. The nonvolatile memory of claim 11, wherein said gate oxide comprises silicon oxide.

13. The nonvolatile memory of claim 11, wherein said textured oxides comprise silicon oxide.

14. The nonvolatile memory of claim 11, wherein said control gate comprises polysilicon.

15. The nonvolatile memory of claim 11, wherein said dielectric layer comprises ONO.

16. The nonvolatile memory of claim 11, wherein said dielectric layer comprises NO.

17. The nonvolatile memory of claim 11, wherein said dielectric layer comprises $Ta_2O_5$.

* * * * *